(12) United States Patent
Greither

(10) Patent No.: US 12,429,528 B2
(45) Date of Patent: Sep. 30, 2025

(54) AIRCRAFT SOLID STATE POWER CONTROLLER AND METHOD OF TESTING AN AIRCRAFT SOLID STATE POWER CONTROLLER

(71) Applicant: HS Elektronik Systeme GmbH, Noerdlingen (DE)

(72) Inventor: Markus Greither, Augsburg (DE)

(73) Assignee: HS Elektronik Systeme GmbH, Noerdlingen (DE)

( * ) Notice: Subject to any disclaimer, the term of this patent is extended or adjusted under 35 U.S.C. 154(b) by 171 days.

(21) Appl. No.: 18/371,983

(22) Filed: Sep. 22, 2023

(65) Prior Publication Data

US 2024/0103093 A1   Mar. 28, 2024

(30) Foreign Application Priority Data

Sep. 23, 2022   (EP) ..................................... 22197477

(51) Int. Cl.
| | | |
|---|---|---|
| *G01R 31/40* | (2020.01) | |
| *B64D 41/00* | (2006.01) | |
| *B64F 5/60* | (2017.01) | |
| *G01R 31/00* | (2006.01) | |
| *H02H 3/24* | (2006.01) | |

(52) U.S. Cl.
CPC ............. *G01R 31/40* (2013.01); *B64D 41/00* (2013.01); *B64F 5/60* (2017.01); *G01R 31/008* (2013.01); *H02H 3/243* (2013.01); *B64D 2221/00* (2013.01)

(58) Field of Classification Search
None
See application file for complete search history.

(56) References Cited

U.S. PATENT DOCUMENTS

| | | |
|---|---|---|
| 4,631,474 A | 12/1986 | Dolland |
| 9,673,611 B2 | 6/2017 | Saloio, Jr. et al. |
| 11,290,101 B2 * | 3/2022 | Ebbinghaus ..... G01R 19/16571 |

FOREIGN PATENT DOCUMENTS

| | | |
|---|---|---|
| DE | 102020104970 A1 | 8/2021 |
| EP | 1763137 A2 | 3/2007 |
| EP | 3975361 A1 | 3/2022 |

OTHER PUBLICATIONS

Extended European Search Report issued by Examiner Mila Palukova, of the European Patent Office, dated Mar. 3, 2023, in corresponding European Patent Application No. 22197477.7.

* cited by examiner

*Primary Examiner* — Farhana A Hoque

(57) ABSTRACT

An aircraft solid state power controller for controlling the supply of electric power from an aircraft electric power supply to an electric load comprises a power input node, which is electrically connectable to an output node of the aircraft electric power supply; a power output node, which is electrically connectable to an electric load and configured for selectively supplying electric power to the electric load; an electric load switch, which is configured for controlling the supply of electric power from the power input node to the power output node; a shunt resistor, which is arranged between the electric load switch and the power output node so that any electric current that is supplied from the aircraft solid state power controller via the power output node to the electric load passes through the shunt resistor; and a control device comprising a voltage sensor that is configured for detecting a voltage drop over the shunt resistor.

20 Claims, 2 Drawing Sheets

AIRCRAFT SOLID STATE POWER CONTROLLER AND METHOD OF TESTING AN AIRCRAFT SOLID STATE POWER CONTROLLER

CROSS-REFERENCE TO RELATED APPLICATIONS

This application claims priority to and the benefit of European Patent Application No. 22197477.7, filed Sep. 23, 2022, the entre content of which is incorporated herein by reference.

TECHNICAL FIELD

The invention is related to aircraft solid state power controller ("SSPC") for controlling the supply of electric power from an electric power supply to at least one electric load within an aircraft. The invention is further related to a method of testing such an aircraft solid state power controller.

BACKGROUND

Modern aircraft usually comprise at least one aircraft solid state power controller ("SSPC") for controlling the supply of electric power from an electric power supply to at least one electric load within the aircraft. The at least one SSPC may in particular be configured to act as an electric safety device ("circuit breaker"), which interrupts the supply of electric power in case the electric current flowing through the SSPC exceeds a predefined threshold. For securing a reliable operation of the at least one SSPC as a circuit breaker, the circuit breaker functionality is to be regularly checked.

It therefore would be beneficial to provide an improved SSPC that allows for an easy, fast and reliable checking of its circuit breaker functionality.

SUMMARY

According to an exemplary embodiment of the invention, an aircraft solid state power controller ("SSPC") for controlling the supply of electric power from an aircraft electric power supply to an electric load comprises a power input node, which is electrically connectable to an output node of the aircraft electric power supply; a power output node, which is electrically connectable to an electric load and configured for selectively supplying electric power to the electric load; an electric load switch, which is configured for controlling the supply of electric power from the power input node to the power output node; a shunt resistor, which is arranged between the electric load switch and the power output node, so that the electric current that is supplied from the aircraft solid state power controller via the power output node to electric load passes through the shunt resistor, and a control device comprising a voltage sensor. The voltage sensor is configured for detecting a voltage drop over the shunt resistor in order to determine the electric current that is flowing through the shunt resistor to the electric load.

The aircraft solid state power controller may be configured for providing a "circuit breaker function", i.e. the aircraft solid state power controller may be configured for switching off the electric load switch for interrupting the supply of electric power to the electric load when the detected voltage drop at the shunt resistor exceeds a predefined threshold.

The SSPC further comprise a stim circuit that is configured for causing an electric stim current to flow as a test current through the shunt resistor. The stim circuit comprises a stim capacitor that is selectively connectable to the shunt resistor for applying an electric voltage to the shunt resistor and causing a stim current to flow through the shunt resistor by discharging the stim capacitor. The stim circuit further comprises a stim switch that is configured for selectively connecting the stim capacitor to the shunt resistor.

Exemplary embodiments of the invention also include a method of testing an SSPC according to an exemplary embodiment of the invention, wherein the method includes: charging the stim capacitor by applying an electric voltage to the stim capacitor; switching on the stim switch for electrically connecting the stim capacitor with the shunt resistor and causing an electric stim current to flow through the shunt resistor; and measuring the voltage drop over the shunt resistor.

The method may further include switching off the electric load switch before the stim switch is switched on, in order to prevent distortions caused by a load current flowing through the electric load.

The electric stim current may be a short current pulse or spike, in particular a current pulse having a length in the range of 10 µs to 1 ms, more particular a current pulse having a length in the range of 50 µs to 500 µs.

The capacity of the stim capacitor may be selected so that the maximum stim current flowing through the shunt resistor is similar, i.e. in the same order of magnitude, as the load current that is flowing through the shunt resistor and the load during normal operation. The stim capacitor may in particular be selected so that the stim circuit exceeds the predefined threshold. In consequence, the control device should detect an overcurrent flowing through the shunt resistor, when the stim capacitor is discharged through the shunt resistor. Thus, detecting an overcurrent confirms that the circuit breaker functionality of the SSPC is correctly working, whereas a malfunction of the SSPC is identified in case no overcurrent is detected when the stim capacitor is discharged.

An SSPC and a method of testing an SSPC according to exemplary embodiments of the invention allow reliably and conveniently checking the circuit breaker functionality of the SSPC, in particular the overcurrent detection functionality of the SSPC without additional tools.

Exemplary embodiments of the invention allow conveniently testing the circuit breaker functionality of the SSPC before and after the SSPC has been installed with an aircraft. As a result, the costs and the effort for checking the circuit breaker functionality of the SSPC may be reduced, and the safety of aircraft comprising an SSPC according to an embodiment of the invention may be enhanced.

The electric load switch may be a solid state power switch, which is capable of switching large electric powers. The electric load switch may in particular capable to switch electric powers of up to 1000 kW, voltages in the range of 28 V to 3000 V, in particular voltages in the range of 1500 V to 3000 V, and electric currents of up to 1000 A.

The electric load switch may be a solid state power switch, in particular a power transistor, such as an insulated-gate bipolar transistor (IGBT) or a field-effect transistor (FET), in particular a metal-oxide-semiconductor field-effect transistor (MOSFET).

The stim switch may be a solid state switch as well, in particular a transistor, such as an insulated-gate bipolar transistor (IGBT) or a field-effect transistor (FET), in particular a metal-oxide-semiconductor field-effect transistor (MOSFET).

The stim switch may be configured for switching voltages in the range of 28 V and 3000 V, in particular voltages in the range of 1500 V to 3000 V, and electric currents of up to 1000 A. Since the stim current is not constantly flowing through the shunt resistor, but only a short current pulse or spike having a length of not more than 1 ms is caused to flow through the stim switch and the shunt resistor, the stim switch needs to withstand the electric power of the stim current only for a short period time.

Insulated-gate bipolar transistors and field-effect transistors, in particular metal-oxide-semiconductor field-effect transistors, provide reliable and durable solid state power switching devices, which are capable to switch large electric loads, in particular high electric voltages and/or large electric currents. Such transistors are not affected by accelerations and vibrations, as they occur in an aircraft. They also have a long lifetime and are available at reasonable costs.

The stim capacitor may have a capacity in the range 10 µF to 470 µF, in particular a capacity in the range 100 µF to 270 µF. Such capacities have been found as well suited for generating an appropriate electric stim current.

The stim capacitor is configured for being loaded with a voltage in the range of 7 V to 20 V before being connected to the shunt resistor.

The shunt resistor may have a resistivity in the range of 10 µΩ to 10 mΩ, in particular a resistivity in the range of 50 µΩ to 1 mΩ. Such resistivities have been found as well suited for generating an appropriate electric stim current.

In order to avoid electromagnetic distortions caused by high frequency components, which may be generated when the stim capacitor is rapidly discharged, a low-pass filter may be provided in the electric connection between the shunt resistor and the voltage sensor. The low-pass filter may in particular comprise a low-pass filter capacitor and a low-pass filter resistor.

The low-pass filter may be designed to have a cutoff-frequency in the range of 1 kHz to 1 MHz, in particular a cutoff-frequency in the range of 5 kHz to 500 kHz, more particularly a cutoff-frequency between 10 kHz and 500 kHz.

The SSPC may further comprise an isolated electric power supply for providing an electric output to the control device and/or to the stim circuit. The electric output provided by the isolated electric power supply may in particular be galvanically isolated from the aircraft power supply.

The isolated electric power supply may be configured for providing a voltage that differs from the electric voltage supplied by the aircraft power supply.

The isolated electric power supply may in particular be configured for providing a DC voltage in the range of between 7 V and 20 V.

The stim capacitor may be charged either by the isolated electric power supply or by the aircraft electric power supply. The stim capacitor may be charged by the aircraft electric power supply in particular in aircraft electric power supply systems operating at low voltages, in particular at voltages below 100 V, for example at a voltage of 28 V.

BRIEF DESCRIPTION OF THE DRAWINGS

So that those skilled in the art to which the subject disclosure appertains will readily understand how to make and use the devices and methods of the subject disclosure without undue experimentation, other embodiments thereof will be described in detail herein below with reference to certain figures, wherein.

DETAILED DESCRIPTION

In the following, an SSPC according to an exemplary embodiment of the invention is described with reference to the enclosed figures.

Figure 1:
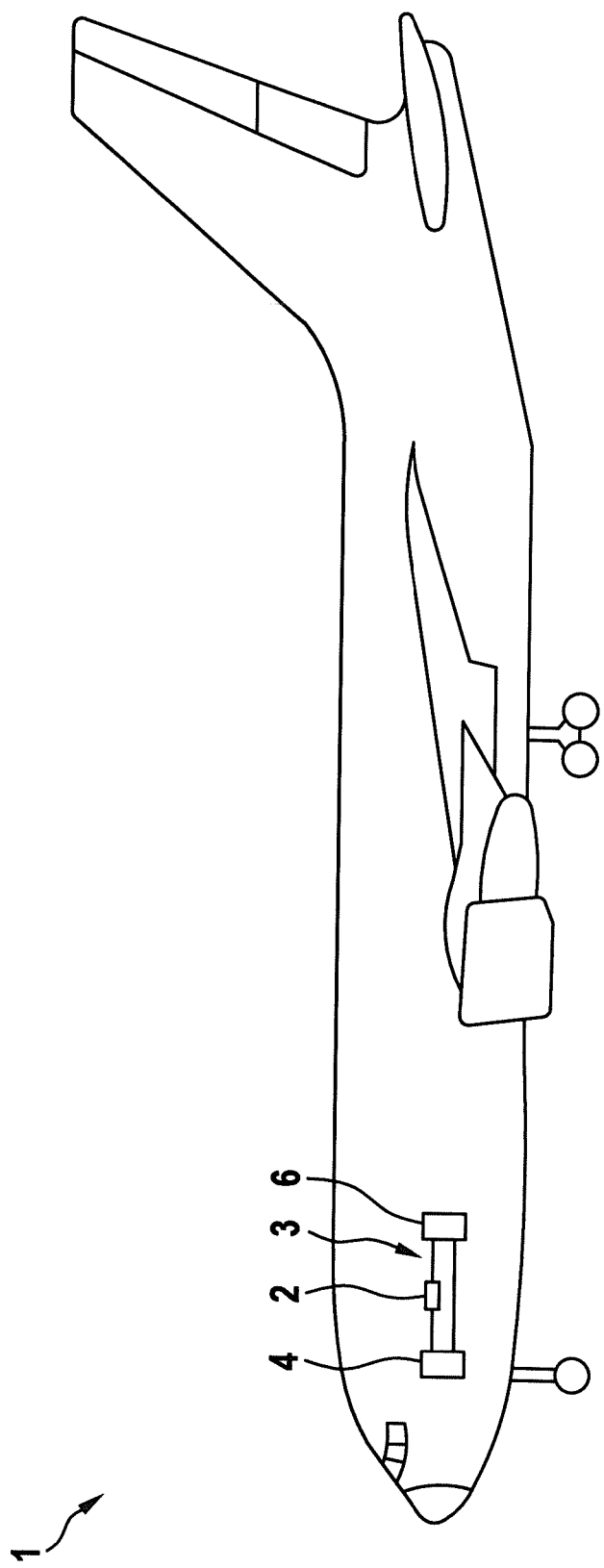
FIG. 1 shows an aircraft comprising an aircraft solid state power controller according to an exemplary embodiment of the invention.

FIG. 1 shows an aircraft 1, in particular an airplane, which is equipped with an aircraft electric power supply system 3 including an aircraft electric power supply 4, an electric load 6, and an aircraft solid state power controller (SSPC) 2 according to an exemplary embodiment of the invention, which is configured for controlling the supply of electric power from the aircraft electric power supply 4 to the electric load 6.

Although the aircraft electric power supply system 3 depicted in FIG. 1 includes only a single aircraft electric power supply 4, a single electric load 6, and a single SSPC 2, respectively, alternative embodiments of aircraft electric power supply system 3 may comprise more the one of each of said components, respectively.

An aircraft electric power supply system 3 may in particular include a plurality of SSPCs 2, wherein each SSPC 2 includes numerous SSPC channels of the type depicted in FIG. 2 and described in the following.

Figure 2:
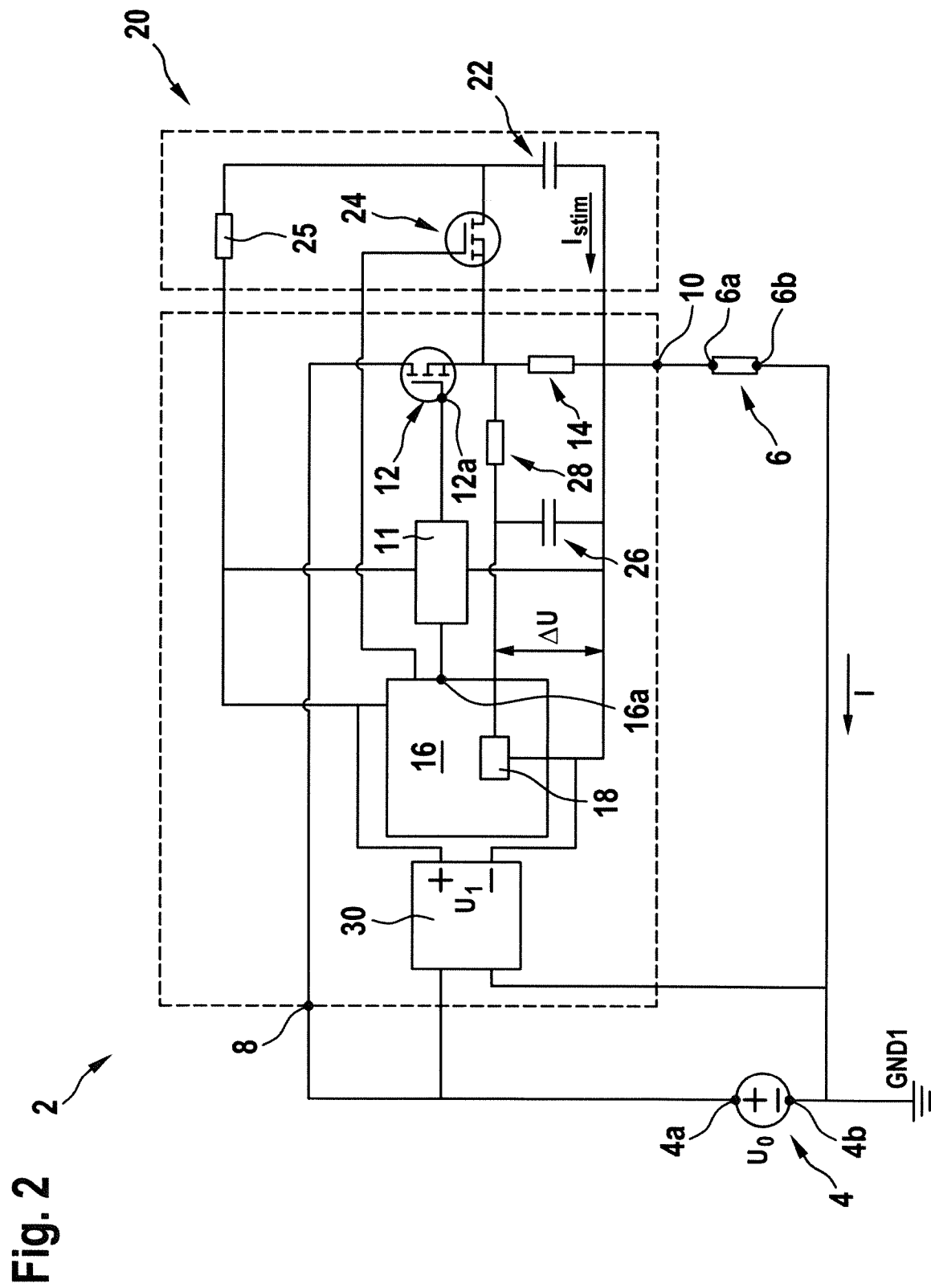
FIG. 2 shows a circuit diagram of an aircraft solid state power controller according to an exemplary embodiment of the invention.

FIG. 2 shows a circuit diagram of a SSPC 2 according to an exemplary embodiment of the invention.

The SSPC 2 is configured for controlling the supply of electric power from the aircraft electric power supply 4 to the electric load 6.

The SSPC 2 comprises a power input node 8 and a power output node 10. The power input node 8 is electrically connected to a first node 4a of the aircraft electric power supply 4, and the power output node 10 is electrically connected to a first node 6a of the electric load 6. An second node 6b of the load 6 is connected to a second node 4b of the aircraft electric power supply 4.

The aircraft electric power supply 4 may be a DC power supply, which is configured to supply electric voltages $U_0$ in the range of between 28 V and 3000 V, in particular electric voltages $U_0$ in the range of between 1500 V and 3000 V.

In the embodiment depicted in FIG. 2, the SSPC 2 is connected between the positive (+) pole 4a of the aircraft electric power supply 4 and the positive (+) pole 6a of the electric load 6. In a alternative embodiment, which is not explicitly depicted in the figures, the SSPC 2 may be connected between the negative (−) pole 4b of the aircraft electric power supply 4 and the negative (−) pole 6b of the electric load 6.

The SSPC 2 comprises an electric load switch 12, which is configured for controlling the supply of electric power from the power input node 8 to the power output node 10 of the SSPC 2. Thus, the supply of electric power from the aircraft electric power supply 4 to the electric load 6 may by controlled, in particular switched on and off, by controlling, in particular switching, the electric load switch 12.

The electric load switch 12 may be a solid state power switch, which is capable to switch large electric powers. The electric load switch 12 may in particular capable to switch electric powers of up to 1000 kW, voltages in the range of 28 V and 3000 V, in particular electric voltages $U_O$ in the range of between 1500 V and 3000 V, and electric currents of up to 1000 A.

The electric load switch 12 may be a solid state power switch, in particular a power transistor, for example a power insulated-gate bipolar transistor (IGBT) or a power field-effect transistor (FET), in particular a power metal-oxide-semiconductor field-effect transistor (MOSFET).

The SSPC 2 further includes a shunt resistor 14, which is electrically connected between the electric load switch 12 and the power output node 10. In consequence, the electric current $I_{load}$ that is supplied from the SSPC 2 via the electric load switch 12 and the power output node 10 to the electric load 6 passes through the shunt resistor 14. The shunt resistor may have a resistivity $R_{shunt}$ in the range of 10 µΩ to 10 mΩ, in particular a resistivity $R_{shunt}$ in the range of 50 µΩ to 1 mΩ.

The SSPC 2 further comprises a control device 16 for controlling the electric load switch 12 via a gate driver 11. The control device 16 includes a voltage sensor 18. The voltage sensor 18 is electrically connected parallel to the shunt resistor 14 for detecting a voltage drop ΔU over the shunt resistor 14. According to Ohm's law, the voltage drop ΔU over the shunt resistor 14 is proportional to the electric current $I_{shunt}$ flowing through the shunt resistor 14: $\Delta U = R_{shunt} * I_{shunt}$.

In consequence, when the electric current $I_{shunt}$ flowing through the electric load 6 exceeds a predefined maximum current $I_{max}$, the voltage drop ΔU over the shunt resistor 14 exceeds a predefined threshold $U_{th} = R_{shunt} * I_{max}$.

For providing the circuit breaker functionality of the SSPC 2, the control device 16 may be configured to switch off the supply of electric power to the electric load 6 by switching off the electric load switch 12, when the voltage drop ΔU over the shunt resistor 14, which is detected by the voltage sensor 18, exceeds the predefined threshold $U_{th}$.

The SSPC 2 also comprises an isolated electric power supply 30 for providing an electric power output to the control device 16. The electric power output provided by the isolated electric power supply 30 supply may be galvanically isolated from the electric output provided by the aircraft power supply 4. The isolated electric power supply 30 may in particular be configured for providing an electric DC power output, more particularly an electric DC power output having a voltage $U_1$ in the range of 7 V to 20 V.

The SSPC 2 further comprises a stim circuit 20 that allows causing an electric stim current $I_{stim}$ to flow through the shunt resistor 14.

The stim circuit 20 comprises a stim capacitor 22, a stim switch 24, and a stim resistor 25. The stim capacitor 22 is electrically connected to an output node of the isolated electric power supply 30 via the stim resistor 25, so that the stim capacitor 22 may be charged by the isolated electric power supply 30 via the stim resistor 25.

In an alternative embodiment, which is not explicitly depicted in the figures, the stim capacitor 22 may be charged by the aircraft power supply 4 instead of the isolated electric power supply 30. This may in particular apply to aircraft electric power supply system 3 that are operated at low voltages, in particular at voltages below 100 V, for example at a voltage of 28 V.

The stim switch 24 is configured for selectively connecting the stim capacitor 22 to the shunt resistor 14. When the stim switch 24 is switched on, so that it electrically connects the stim capacitor 22 to the shunt resistor 14, the stim capacitor 22 is discharged through the shunt resistor 14. Discharging the stim capacitor 22 through the shunt resistor 14 causes a stim current $I_{stim}$ to flow through the shunt resistor 14. The stim current $I_{stim}$ flowing through the shunt resistor 14 results in a voltage drop $\Delta U = \Delta U_{stim}$ over the shunt resistor 14. This voltage drop ΔU may be detected by the voltage sensor 18 of the control device 16.

The stim switch 24 may be a solid state switch, in particular a transistor, for example an insulated-gate bipolar transistor (IGBT) or a power field-effect transistor (FET), in particular a power metal-oxide-semiconductor field-effect transistor (MOSFET).

The stim switch 24 may be configured for switching voltages in the range of 7 V and 20 V, and electric currents of up to 20 A. Contrary to the electric load switch 12, the stim switch 24 needs to withstand the electric power of the stim current $I_{stim}$ only for a short period time, as the stim current $I_{stim}$ is not constantly flowing through the shunt resistor 14, but only a short current pulse or spike having a length of not more than 1 ms is caused to flow through the shunt resistor 14.

The capacity of the stim capacitor 22 is selected so that the stim current $I_{stim}$, which flows through the shunt resistor 14 when the stim switch 24 is switched on, is similar to, i.e. it is in the same order of magnitude, as the load current $I_{load}$, which flows through the load 6 during normal operation, when the electric load switch 12 is switched on.

In consequence, the voltage drop $\Delta U_{stim}$ over the shunt resistor 14, which is detected by the voltage sensor 18 of the control device 16, is similar to the voltage drop ΔU over the shunt resistor 14 that is caused by the electric current $I_{load}$ flowing through the load 6 during normal operation. The stim capacitor 22 may have a capacity $C_{stim}$ in the range 10 µF to 470 µF, in particular a capacity $C_{stim}$ in the range 100 µF to 270 µF.

The stim capacitor 22 may in particular be selected so that the stim current $I_{stim}$ flowing through the shunt resistor 14 exceeds the predefined maximum current $I_{max}$, and, in consequence, the voltage drop $\Delta U_{stim}$ over the shunt resistor 14 exceeds the predefined threshold $U_{th}$. In consequence, an overcurrent situation should be identified by the control device 16.

Thus, detecting an overcurrent by the control device 16 confirms that the circuit breaker functionality of the SSPC is correctly working. Correspondingly, a malfunction of the SSPC is identified in case no overcurrent is detected when the stim capacitor 22 is discharged.

Thus, a stim circuit 20 according to an exemplary embodiment of the invention allows for testing the circuit breaker functionality of the SSPC 2 by causing a sufficiently large stim current $I_{stim}$ to flow through the shunt resistor 14.

The stim current $I_{stim}$ may be in the range of 1 A to 20 A, and the predefined threshold $U_{th}$ of the voltage drop ΔU at the shunt resistor 14 may be in the range of 100 mV to 1 V, in particular in the range of 200 mV to 750 mV.

The electric load switch 12 may be switched off before the stim switch 24 is switched on in order to prevent an additional voltage drop $\Delta U_{load}$ caused by a load current $I_{load}$ flowing through the electric load 6, which could falsify the test result.

Since the generated stim current $I_{stim}$ is a short current pulse or spike, high frequency components (high harmonics) may be generated together with the stim current $I_{stim}$. In order to avoid electromagnetic distortions, which may be caused by these high frequency components, a low-pass filter 26, 28 comprising a low-pass filter capacitor 26 and a low-pass filter resistor 28 is provided in the electric connection between the shunt resistor 14 and the voltage sensor 18.

The low-pass filter 26, 28 may have a cutoff-frequency $f_C$ in the range of 1 kHz to 1 MHz, in particular a cutoff-frequency $f_C$ in the range of 5 kHz to 500 kHz, more particularly a cut-off-frequency $f_C$ between 10 kHz and 500 kHz.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. An aircraft solid state power controller for controlling a supply of electric power from an aircraft electric power supply to an electric load, the aircraft solid state power controller providing a circuit breaker function and comprising:
   a power input node, which is electrically connectable to an output node of the aircraft electric power supply;
   a power output node, which is electrically connectable to an electric load and configured for selectively supplying electric power to the electric load;
   an electric load switch, which is configured for controlling a supply of electric power from the power input node to the power output node;
   a shunt resistor, which is arranged between the electric load switch and the power output node so that any electric current that is supplied from the aircraft solid state power controller via the power output node to the electric load passes through the shunt resistor;
   a control device comprising a voltage sensor that is configured for detecting a voltage drop over the shunt resistor; and
   a stim circuit that is configured for causing an electric stim current to flow through the shunt resistor, the stim circuit comprising:
   a stim capacitor that is selectively connectable to the shunt resistor for applying an electric voltage to the shunt resistor causing the stim current to flow through the shunt resistor by discharging the stim capacitor; and
   a stim switch that is configured for selectively connecting the stim capacitor to the shunt resistor.

2. The aircraft solid state power controller according to claim 1, wherein at least one of the electric load switch or the stim switch is a solid state switch.

3. The aircraft solid state power controller according to claim 2, wherein the solid state switch is a field-effect transistor or a metal-oxide-semiconductor field-effect transistor.

4. The aircraft solid state power controller according to claim 1, further comprising a low-pass filter, which is arranged between the shunt resistor and the voltage sensor.

5. The aircraft solid state power controller according to claim 4, wherein the low-pass filter has a cutoff-frequency in a range of 1 kHz to 1 MHz.

6. The aircraft solid state power controller according to claim 5, wherein the low-pass filter has a cutoff-frequency in a range of 10 kHz to 500 kHz.

7. The aircraft solid state power controller according to claim 1, wherein the stim capacitor has a capacity in a range 10 µF to 470 µF.

8. The aircraft solid state power controller according to claim 7, wherein the stim capacitor has a capacity in a range 100 µF to 270 µF.

9. The aircraft solid state power controller according to claim 1, wherein the stim capacitor is configured for being loaded with a voltage in a range of 7 V to 20 V before being connected to the shunt resistor.

10. The aircraft solid state power controller according to claim 1, further comprising an isolated electric power supply configured for providing an electric output to the control device and to the stim circuit, wherein the electric output provided by the isolated electric power supply is galvanically isolated from the aircraft electric power supply, wherein the isolated electric power supply is configured for providing an electric DC power output.

11. The aircraft solid state power controller according to claim 10, wherein the isolated electric power supply is configured for supplying electric power having a voltage in a range of 7 V to 20 V.

12. The aircraft solid state power controller according to claim 1, wherein the electric load switch is configured for switching electric loads of up to 1000 kW, voltages of up to 3000 V, and/or electric currents of up to 1000 A.

13. The aircraft solid state power controller according to claim 1, wherein the shunt resistor has a resistivity in a range of 10 µΩ to 10 mΩ.

14. The aircraft solid state power controller according to claim 13, wherein the shunt resistor has a resistivity in a range of 50 µΩ to 1 mΩ.

15. The aircraft solid state power controller according to claim 1, wherein the control device is configured for switching off the electric load switch for interrupting the supply of electric power to the electric load when the detected voltage drop at the shunt resistor exceeds a predefined threshold.

16. An aircraft comprising:
   an aircraft electric power supply;
   at least one electric load; and
   an aircraft solid state power controller according to claim 1, which is configured for controlling the supply of electric power from the aircraft electric power supply to the at least one electric load;
   wherein the aircraft electric power supply is configured for providing an electric DC power output.

17. The aircraft according to claim 16, wherein the electric DC power output is a voltage in a range of 1500 V to 3000 V.

18. A method of testing an aircraft solid state power controller according to claim 1, wherein the method includes:
   charging the stim capacitor by applying the electric voltage to the stim capacitor;
   switching on the stim switch for electrically connecting the stim capacitor with the shunt resistor and causing the electric stim current to flow through the shunt resistor; and
   measuring the voltage drop over the shunt resistor.

19. The method according to claim 18, wherein the method further includes comparing the measured voltage drop with a predefined voltage drop threshold and indicating a malfunction of the aircraft solid state power controller if the measured voltage drop does not exceed the predefined voltage drop threshold.

20. The method according to claim 18, wherein the method further includes switching off the electric load switch before switching on the stim switch.

* * * * *